US012415763B2

(12) United States Patent
Harrison et al.

(10) Patent No.: US 12,415,763 B2
(45) Date of Patent: Sep. 16, 2025

(54) HIGH PURITY INGOT FOR WAFER PRODUCTION

(71) Applicant: FREE FORM FIBERS, LLC, Saratoga Springs, NY (US)

(72) Inventors: Shay L. Harrison, East Schodack, NY (US); John L. Schneiter, Cohoes, NY (US); Joseph Pegna, Saratoga Springs, NY (US); Ram K. Goduguchinta, Ballston Lake, NY (US); Kirk L. Williams, Saratoga Springs, NY (US); Erik G. Vaaler, Redwood City, CA (US)

(73) Assignee: Free Form Fibers, LLC, Saratoga Springs, NY (US)

( * ) Notice: Subject to any disclaimer, the term of this patent is extended or adjusted under 35 U.S.C. 154(b) by 911 days.

(21) Appl. No.: 17/580,990

(22) Filed: Jan. 21, 2022

(65) Prior Publication Data

US 2022/0144711 A1   May 12, 2022

Related U.S. Application Data

(63) Continuation-in-part of application No. 17/156,746, filed on Jan. 25, 2021.
(Continued)

(51) Int. Cl.
*C30B 25/02* (2006.01)
*C01B 32/963* (2017.01)
(Continued)

(52) U.S. Cl.
CPC ...... *C04B 35/62281* (2013.01); *C01B 32/963* (2017.08); *C23C 16/325* (2013.01);
(Continued)

(58) Field of Classification Search
CPC ............. C30B 25/02; C04B 35/62281; C04B 35/62695; G21C 3/58; C01B 32/963; C23C 16/325
See application file for complete search history.

(56) References Cited

U.S. PATENT DOCUMENTS 3,062,683 A    11/1962  Kalleberg et al.
3,148,102 A    9/1964   Eakins et al.
(Continued)

FOREIGN PATENT DOCUMENTS

CA    2339804 A1 *  2/2000
CN    103387230 A   11/2013
(Continued)

OTHER PUBLICATIONS

Wallenberger et al., "Strong, Small Diameter, Boron Fibers by LCVD", Materials Letters, vol. 14 (1992), pp. 198-202.
(Continued)

*Primary Examiner* — Robert M Kunemund
(74) *Attorney, Agent, or Firm* — Kevin P. Radigan, Esq.; Heslin Rothenberg Farley & Mesiti P.C.

(57) ABSTRACT

A method of forming a high purity ingot for wafer production, such as a silicon carbidewafer. Precursors are added to a reactor; at least part of a fiber is formed in the reactor from the precursors using chemical deposition interacting with the precursors; and granular material is then formed from the fiber. The method further includes forming the ingot from the granular material. In one aspect, the chemical deposition can include laser induced chemical vapor deposition. Further, the method can include separating one or more wafers from the ingot for use in semiconductor fabrication.

14 Claims, 12 Drawing Sheets

Related U.S. Application Data

(60) Provisional application No. 62/966,157, filed on Jan. 27, 2020.

(51) Int. Cl.

| | | |
|---|---|---|
| *C04B 35/622* | (2006.01) | |
| *C23C 16/32* | (2006.01) | |
| *G21C 3/58* | (2006.01) | |
| *C04B 35/626* | (2006.01) | |

(52) U.S. Cl.
CPC .............. *C30B 25/02* (2013.01); *G21C 3/58* (2013.01); *C04B 35/62695* (2013.01)

(56) References Cited

U.S. PATENT DOCUMENTS

| | | |
|---|---|---|
| 3,535,187 A | 10/1970 | Wood |
| 3,755,061 A | 8/1973 | Schurb |
| 3,958,406 A | 5/1976 | Corbiere |
| 4,076,380 A | 2/1978 | DiMarcello |
| 4,295,890 A | 10/1981 | Stroke |
| 4,539,248 A | 9/1985 | Brockington et al. |
| 4,588,699 A | 5/1986 | Brennan et al. |
| 4,962,070 A | 10/1990 | Sullivan |
| 5,096,739 A | 3/1992 | Strutt et al. |
| 5,134,020 A | 7/1992 | Cotteret et al. |
| 5,296,288 A | 3/1994 | Kourtides et al. |
| 5,326,731 A | 7/1994 | Bhola et al. |
| 5,342,022 A | 8/1994 | Artjushenko et al. |
| 5,399,430 A | 3/1995 | Nordine et al. |
| 5,705,122 A | 1/1998 | Curran |
| 5,786,023 A | 7/1998 | Maxwell et al. |
| 5,955,391 A | 9/1999 | Kameda et al. |
| 6,183,714 B1 | 2/2001 | Smalley et al. |
| 6,291,058 B1 | 9/2001 | Goujard et al. |
| 6,322,889 B1 | 11/2001 | Lara-Curzio et al. |
| 6,323,413 B1 | 11/2001 | Roth et al. |
| 6,446,814 B1 | 9/2002 | King |
| 6,706,400 B2 | 3/2004 | Mercuri et al. |
| 7,657,142 B2 | 2/2010 | Gasca et al. |
| 7,666,475 B2 | 2/2010 | Morrison |
| 9,206,508 B1 | 12/2015 | Hariharan et al. |
| 9,217,210 B2 | 12/2015 | Velev et al. |
| 9,896,385 B2 | 2/2018 | Harrison et al. |
| 9,938,393 B2 | 4/2018 | Schneiter et al. |
| 10,047,015 B2 | 8/2018 | Pegna et al. |
| 10,546,661 B2 | 1/2020 | Pegna et al. |
| 10,676,391 B2 | 6/2020 | Harrison et al. |
| 10,876,227 B2 | 12/2020 | Harrison et al. |
| 2002/0085968 A1 | 7/2002 | Smalley |
| 2003/0044615 A1 | 3/2003 | Yanagisawa et al. |
| 2003/0168146 A1 | 9/2003 | Wenstrup et al. |
| 2005/0048859 A1 | 3/2005 | Canahan et al. |
| 2005/0082676 A1 | 4/2005 | Andry et al. |
| 2005/0181192 A1 | 8/2005 | Steffier |
| 2005/0247904 A1 | 11/2005 | Raj et al. |
| 2005/0255033 A1 | 11/2005 | Shimoji et al. |
| 2006/0039524 A1 | 2/2006 | Feinroth et al. |
| 2006/0115648 A1 | 6/2006 | Chen |
| 2007/0093587 A1 | 4/2007 | Shen et al. |
| 2008/0143209 A1 | 6/2008 | Tan et al. |
| 2008/0153959 A1 | 6/2008 | Charati et al. |
| 2008/0175988 A1 | 7/2008 | Chiu et al. |
| 2009/0064476 A1 | 3/2009 | Cross et al. |
| 2010/0040834 A1 | 2/2010 | Dawes et al. |
| 2010/0055352 A1 | 3/2010 | Maxwell |
| 2011/0124483 A1 | 5/2011 | Shah et al. |
| 2011/0170653 A1 | 7/2011 | Cabrero et al. |
| 2011/0274906 A1 | 11/2011 | Kim et al. |
| 2011/0286570 A1 | 11/2011 | Farmer et al. |
| 2011/0311427 A1 | 12/2011 | Hauge et al. |
| 2012/0002777 A1 | 1/2012 | Lahoda et al. |
| 2012/0073495 A1* | 3/2012 | Urakami ............... C30B 29/36 |
| | | 117/106 |
| 2012/0076718 A1 | 3/2012 | Liu et al. |
| 2012/0135224 A1 | 5/2012 | Guzman de Villoria et al. |
| 2012/0287553 A1 | 11/2012 | Ramani et al. |
| 2012/0308758 A1* | 12/2012 | Hori .................. C30B 23/00 |
| | | 428/64.1 |
| 2012/0315467 A1 | 12/2012 | Lafdi et al. |
| 2012/0315815 A1 | 12/2012 | Fong et al. |
| 2013/0010915 A1 | 1/2013 | Garnier et al. |
| 2013/0077731 A1 | 3/2013 | Sherwood et al. |
| 2013/0093122 A1 | 4/2013 | Schultz et al. |
| 2013/0163711 A1 | 6/2013 | Zabiego et al. |
| 2013/0329849 A1 | 12/2013 | Mazaudier |
| 2014/0170919 A1 | 6/2014 | Manipatruni et al. |
| 2015/0004393 A1 | 1/2015 | Pegna et al. |
| 2016/0208412 A1 | 7/2016 | Sandgren et al. |
| 2016/0347672 A1 | 12/2016 | Harrison |
| 2017/0213604 A1 | 7/2017 | Pegna et al. |
| 2017/0321345 A1* | 11/2017 | Xu ..................... C30B 29/36 |
| 2017/0326838 A1 | 11/2017 | Pegna et al. |
| 2017/0331022 A1 | 11/2017 | Pegna et al. |
| 2017/0369998 A1 | 12/2017 | Pegna et al. |
| 2018/0087157 A1 | 3/2018 | Harrison et al. |
| 2018/0087214 A1 | 3/2018 | Harrison et al. |
| 2018/0148864 A1 | 5/2018 | Harrison et al. |
| 2018/0370860 A1 | 12/2018 | Pegna et al. |
| 2019/0062222 A1 | 2/2019 | Pegna et al. |
| 2019/0106807 A1* | 4/2019 | Lin ..................... H10D 62/53 |
| 2021/0087726 A1 | 3/2021 | Pegna et al. |
| 2021/0230743 A1 | 7/2021 | Harrison et al. |

FOREIGN PATENT DOCUMENTS

| | | |
|---|---|---|
| CN | 104185314 A | 8/2014 |
| CN | 107984812 A | 5/2018 |
| EP | 1 209 123 A2 | 5/2002 |
| GB | 2054542 B | 1/1983 |
| JP | S 61-132628 A | 6/1986 |
| JP | S 62121643 A | 6/1987 |
| JP | H 03-285877 A | 12/1991 |
| JP | H 07-252662 A | 3/1995 |
| JP | H 09-268065 A | 10/1997 |
| JP | H 10-059780 A | 3/1998 |
| JP | 2002-211980 A | 7/2002 |
| JP | 2005-231952 A | 9/2005 |
| JP | 2006225648 A | 8/2006 |
| JP | 2013194073 A | 9/2013 |
| JP | 2013-210372 A | 10/2013 |
| WO | WO 1988/001204 A1 | 2/1988 |
| WO | WO 2010/090624 A1 | 8/2010 |
| WO | WO 2012/109841 A1 | 8/2012 |
| WO | WO 2013/180764 A1 | 12/2013 |
| WO | WO 2014/143937 A1 | 9/2014 |
| WO | WO 2015/112935 A1 | 7/2015 |
| WO | WO 2015/200257 A1 | 12/2015 |
| WO | WO 2017/197082 A1 | 11/2017 |
| WO | WO 2017/197105 A1 | 11/2017 |
| WO | WO 2018/064261 A1 | 4/2018 |
| WO | WO 2018/102352 A1 | 6/2018 |

OTHER PUBLICATIONS

Johansson et al., "Microfabrication of Three-Dimensional Boron Structures by Laser Chemical Processing", Journal of Applied Physics, vol. 72, No. 12, (1992), (8 pages).

Wallenberger, Frederick T., "Inorganic Fibres and Microfabricated Parts by Laser Assisted Chemical Vapour Deposition (LCVD): Structures and Properties*", Ceramics International, vol. 23, (1997), pp. 119-126.

Maxwell et al., "Real-Time Volumetric Growth Rate Measurements and Feedback Control of Three-Dimensional Laser Chemical Vapor Deposition", Appl. Phys. A, vol. 67, No. 3, (1998), pp. 323-329.

Waku et al., "An Amorphous Ceramic Al32.4Er7.6O60 Fiber with Large Viscous Flow Deformation and a High-Strength Nanocrystallized Ceramic Fiber", Journal of Materials Science, vol. 36, No. 10, (May 2001), pp. 2435-2440.

Wen et al., "Interfacial Microstructure and Reaction of BN-Coated Single Crystal Al2O3 Fiber Reinforced NiAl Matrix Composites",

(56) References Cited

OTHER PUBLICATIONS

Journal of Materials Science, vol. 37, No. 6, (Mar. 2002), pp. 1253-1258.
Kerans et al., "High Temperature Composites", Air Force Research Laboratory Report No. AFRL-ML-WP-TP-2002-407, (Aug. 2002), (22 pages).
Kerans et al., "Interface Design for Oxidation-Resistant Ceramic Composites", Journal of the American Ceramic Society, vol. 85, No. 11, (Nov. 2002), pp. 2599-2632.
Behlau et al., "Mechanical Properties of Carbon and BN Coated SiC Fibers", Ceramic Engineering and Science Proceedings, vol. 24, No. 4, (Jan. 2003), pp. 225-230.
Chen et al., "Carbide Derived Carbon (CDC) Coatings for Tyranno ZMI SiC Fibers", Ceramic Engineering and Science Proceedings, vol. 24, No. 3, (Jan. 2003), pp. 57-62.
Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).
Lee et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.
Maxwell et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.
Longtin et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.
Longtin et al., "Selective Area Synthesis of Aligned Carbon Nanofibers by Laser-Assisted Catalytic Chemical Vapor Deposition", Diamond & Related Materials, vol. 16 (2007) pp. 1541-1549.
Liao et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.
Hu et al., "Oxidation Behavior of Zirconium Diboride-Silicon Carbide at 1800° C.", Scripta Materialia, vol. 57, No. 9, (Nov. 2007), pp. 825-828.
Marsh, John, "Quantum Well Intermixing Revolutionizes High Power Laser Diodes", Diodenlaser, Laser Technik Journal, vol. 4, No. 5, DOI: 10.1002/latj.200790190 (Nov. 2007) (4 pages).
Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, (Oct. 2008), pp. 3670-3672.
Jouanny et al., "Study of TiC Coatings on Nicalon Fibre Prepared by Pressure-Pulsed Reactive Chemical Vapour Deposition at Low Pressure", ECS Translations, vol. 25, No. 8, (Jan. 2009), pp. 1267-1272.
Roy et al., "Atomic Layer Deposition of Alumina Onto Carbon Fibers", Journal of the American Ceramic Society, vol. 94, No. 7, (Jul. 2011), pp. 2014-2022.
Zhang et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.
Gan, Yong X., "Structural Assessment of Nanocomposites", Micron, vol. 43, Issue 7, (2012) pp. 782-817.
Ares et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.
Glazoff et al., "Morphological Analysis of Zirconium Nuclear Fuel Rods Braided with SiC: Quality Assurance and Defect Identification", Journal of Nuclear Materials, vol. 451, Issues 1-3, (Apr. 2014), pp. 216-224.
Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent.cgi?article=1068&context=elecengtheses.
Luo et al., "Microstructure, Tensile Strength and Thermostability of W-core SiC Fibers With or Without Carbon Coating", Materials Science & Engineering: A, vol. 647, (2015), pp. 265-276.
Wang et al., "Synthesis of ZrC-SiC Powders from Hybrid Liquid Precursors with Improved Oxidation Resistance", Journal of the American Ceramic Society, vol. 98, No. 1, (Jan. 2015), pp. 197-204.
Jiang et al., "Fabrication of Barium-Strontium Aluminosilicate Coatings on C/SiC Composites via Laser Cladding", Journal of Materials Science & Technology, vol. 33, No. 2, (2017), pp. 166-171.
Zimmerman et al. "Fragmentation-Driven Grain Refinement in Directional Solidification of AlCu10wit-% Alloy at Low Pulling Speeds", Acta Materialia, vol. 126, (2017) pp. 236-250.
Tanaka, Hidehiko, "Silicon Carbide Powder and Sintered Materials", Journal of the Ceramic Society of Japan, vol. 119, Issue 3, pp. 218-233 (Year: 2011).
Harrison et al., "International Search Report" for PCT/US2021/14857, dated Apr. 8, 2021 (2 pages).
Extended European Search Report, Application No. 2174773.6—1108/4097049 PCT/US2021014857, dated Feb. 14, 2024, 10 pages.

* cited by examiner

HIGH PURITY INGOT FOR WAFER PRODUCTION

CROSS-REFERENCE TO RELATED APPLICATIONS

This application is a continuation-in-part application and claims priority from commonly assigned, co-pending application Ser. No. 17/156,746, filed Jan. 25, 2021, entitled "High Purity Fiber Feedstock for Loose Grain Production", which claimed priority from U.S. Ser. No. 62/966,157, filed Jan. 27, 2020, entitled "High Purity Fiber Feedstock for Loose Grain Production", which is hereby incorporated herein by reference in its entirety. In addition, this application is related to the following patent applications, each of which is hereby incorporated herein by reference in its entirety: US Patent Publication US 2018/0370860 A1 which published Dec. 27, 2018 entitled "Functional High-Performance Fiber Structure"; U.S. Patent Publication No. 2015/0004393 A1, which published Jan. 1, 2015, entitled "High Strength Ceramic Fibers and Methods of Fabrication"; U.S. Pat. No. 10,047,015 B2 which issued Aug. 24, 2018 and PCT Publication No. WO 2013/180764 A1, which published Dec. 5, 2013, both entitled "High Strength Ceramic Fibers and Methods of Fabrication"; U.S. Patent Publication No. 2017/0213604 A1, which published Jul. 27, 2017, entitled "An Additive Manufacturing Technology for the Fabrication and Characterization of Nuclear Reactor Fuel"; PCT Publication No. WO 2015/200257 A1, which published Dec. 30, 2015, entitled "An Additive Manufacturing Technology for the Fabrication and Characterization of Nuclear Reactor Fuel"; U.S. Patent Publication No. 2017/0331022 A1, which published Nov. 16, 2017, entitled "Multilayer Functional Fiber and Method of Making"; PCT Publication No. WO 2017/197105 A1, which published Nov. 16, 2017, entitled "Multilayer Functional Fiber and Method of Making"; U.S. Patent Publication No. 2017/326838 A1, which published Nov. 16, 2017, entitled "Fiber Delivery Assembly and Method of Making"; PCT Publication No. WO 2017/197082 A1, which published Nov. 16, 2017, entitled "Fiber Delivery Assembly and Method of Making"; PCT Publication No. WO 2015/112935 A1, which published Jul. 30, 2015, entitled "Contiguously Blended Nano-Scaled Multi-Phase Fibers"; PCT Publication No. WO 2018/064261 A1, which published Apr. 5, 2018, entitled "Multi-Composition Fiber with Refractory Additive(s) and Method of Making"; PCT Publication No. WO 2018/102352 A1, which published on Jun. 7, 2018, entitled "Fiber With Elemental Additive(s) and Method of Making"; and U.S. Patent Application No. 62/905,598, filed on Sep. 25, 2019, entitled "Non-Woven Micro-Trellis Fabrics and Composite or Hybrid-Composite Materials Reinforced Therewith", each of which is hereby incorporated herein by reference in its entirety.

TECHNICAL FIELD

The present invention relates generally to the field of raw materials, and ingots produced therefrom, and particularly to ingots produced from materials in granular, e.g., powder form, produced from high purity fibers formed using laser chemical vapor deposition.

BACKGROUND

Silicon carbide (SiC) is a man-made material used in wide-ranging engineering applications because of its advantageous material properties, in particular its refractory (high temperature-capable) nature, high hardness, and high strength. There remains a strong need for high purity SiC powder, and other granular materials for other applications, along with efficient, scalable, and controllable methods for their manufacture.

SUMMARY

The shortcomings of the prior art are addressed, and additional advantages are provided by the present invention which in one aspect is a method of forming a high purity ingot, including providing precursors in a reactor; forming at least part of a fiber in the reactor from the precursors using chemical deposition interacting with the precursors; and forming granular material from the fiber. In addition, the method includes forming the ingot from the granular material, such as via physical vapor transport processing. In one embodiment, the granular material is a silicon carbide powder, and the ingot is a silicon carbide ingot. In one aspect, the chemical deposition may include laser induced chemical vapor deposition. The granular material may be formed by grinding or milling the fiber into the granular material, e.g., ball milling the fiber.

In another aspect, a plurality of fibers maybe formed in parallel using a single laser beam, or multiple laser beams that have independent power control, or multiple laser beams that do not have independent power control. At least one element may be added during the chemical deposition, which serves as a free oxygen getter to improve the oxidation resistance of the granular material.

The granular material may in certain aspects be a silicon carbide powder having greater than 90% beta crystalline phase purity and less than 0.25% oxygen contamination; or a multi-element and multiphase composition powder having less than 0.25% oxygen contamination.

Additional features and advantages are realized through the techniques of the present invention. Other embodiments and aspects of the invention are described in detail herein and are considered a part of the claimed invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
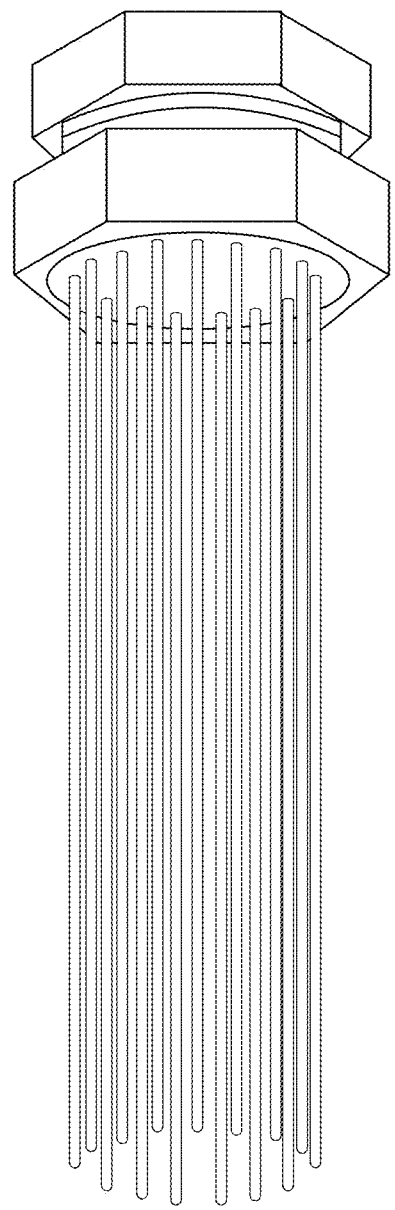
FIG. 1 is a schematic representation of a spinneret, a plate with a pattern of tiny holes through which a liquid precursor is fed, and upon exit, the stream pattern gels into filaments called "green fibers"

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance using either FLP, FFG, or any other fiber formation technique to realize the fibers, and then any fabrication technique to realize the granular material.

One of the most common formats for using SiC is in powder form over a range of particle sizes, from several millimeters in diameter down to less than one micron. The manufacturing approach that has been utilized for over 125 years is the Acheson process, in which a reactor 'bath' (or furnace) of silica (or sand) and powderized coke (carbon) raw materials are mixed together. High voltage current is supplied to the silica-coke mixture through inserted electrodes, creating a carbothermal reaction between the two constituents that reaches temperatures of 2000° C. and greater. The resulting reaction product is an alpha crystalline phase SiC material. Alpha phase SiC is a hexagonal crystalline structure, with two dimension layering like graphite. As a result, the hardness and strength properties are inferior to those found for the beta phase SiC, which is a three dimensional face-centered cubic structure. The beta form of SiC is preferable because of its improved mechanical performance. In order to fabricate beta SiC, the alpha SiC feedstock material must go through a conversion process in high temperature furnaces that can operate for long periods at temperatures ranging from 1700 to 2000 C. Beta SiC powder manufacturers rely on this heat treatment approach, but it suffers from several limitations that affect the performance of the powder in end use applications. These include: (i) conversion percentage of alpha to beta, which is typically in the 80% range but rarely in the 90% or greater regime, (ii) oxygen contamination, which is desired to be below 1% in order to minimize the deleterious effects of oxidation attack, and (iii) manufacturing consistency in terms of both issues (i) and (ii) as well as other considerations like free carbon present. These limitations arise from process variations inherent in the heat treatment conversion process, which include varying quality of the alpha feedstock and instabilities in the furnace control parameters.

Even with these production issues, beta SiC powder is a sought-after material for a range of advanced technologies. Two examples of industrial applications of beta SiC powder are part of ceramic matrix composite (CMC) technology in the aviation/aerospace industry and the additive manufacturing (AM) field. Both applications may require beta SiC for the enhanced mechanical behavior over more readily available alpha SiC powder. In aviation CMC fabrication, beta SiC powder is added as a filler material during the matrix formation steps in order to fill volume and ultimately reduce the porosity (unfilled space) in the final component part cross-section. AM processing uses the powder as the primary constituent material, delivered via the manufacturer's proprietary slurry system. Both high technology applications are emerging from laboratory and pilot scale production to true industrial scale volumes in order to satisfy increasing performance demands.

In accordance with the above-incorporated U.S. and international patent applications, laser-driven chemical vapor deposition (LCVD) is a demonstrated approach for forming high performance fibers. The core concept is the introduction of a single laser beam or, in one embodiment, a multiple beam array into an enclosed chamber or reactor that contains a desired mixture of precursor gases. The laser beam(s) intersect with a substrate surface or other seed material to initiate the gas-phase reaction which yields a solid product (e.g., fiber) of the desired chemistry and crystallinity. The fiber format can be produced as the substrate is pulled away and the reaction product is continuously and additively formed on the material previously deposited. The LCVD process yields a range of advantages, including (i) high deposition rates on the order of hundreds of microns per second, (ii) very high purity deposited material with no undesired contaminants like free oxygen, (iii) high crystalline phase purity, and (iv) the potential for mass parallelization of fiber production using multiple laser beam LCVD as disclosed in the above-incorporated patent applications.

In accordance with an aspect of the present invention, SiC powders are produced using the intermediate step of first producing SiC fibers, and then processing the fibers into a granular, e.g., powder form. The resultant powder retains all of the advantages of the LCVD-formed fibers, including but not limited to, high chemical and phase purity, and low contamination. Moreover, the high speed and scale-ability of the LCVD production of multiple fibers in parallel can be leveraged to increase the speed and quantities of powder produced.

Therefore, in accordance with the present invention, all advantages hold true for powder production that is based on an intermediate LCVD fiber fabrication process, several examples of which (FLP and FFG) are first presented here.

LCVD Example—Fiber Laser Printer™ (FLP)

The FLP offers an extremely versatile approach to the production of inorganic filaments. It is nearly independent of the fiber's material; a rare property among manufacturing processes, which is referred to as "Material-Agnostic". For example, the FLP has been applied to the demonstration of filaments for which no other manufacturing method is known: boron carbide; boron; tungsten carbide (with exceptional hardness of 27-29 Gpa); and tertiary Si—C—B fibers (with exceptional tensile strength of 9 Gpa). The assignee has demonstrated that it was possible to produce fibers with varying composition functionally graded along their axis. As further demonstration of the material-agnostic qualities of the FLP, the assignee demonstrated that it is possible to vary fiber composition and the radial distribution of microstructure. For example, the assignee has demonstrated the ability to customize SiCf microstructure distribution, with distributions ranging from (i) elongated anisotropic grains at the fiber center morphing into equiaxed fine grains at the fibers edge to (ii) uniform microstructure across the fiber. These unique characteristics contribute to the superior materials properties found in LCVD-produced fibers, such as the excellent creep resistance exhibited by the assignee's laser printed SiCf.

The assignee has also demonstrated that fibers can be coated in the FLP as fibers are being produced; a first in the industry. Interphases of Boron Nitride or Pyrolytic Carbon (PyC), with an added SiC overcoat have been deposited. Such coatings were shown feasible within a large dimensional window ranging from 10's of nanometers (nm) to ~10 μm. This is a valuable feature of the FLP as (i) interphase coating is required for the material to exhibit composite behavior; and (ii) there still are no satisfactory solutions to produce a uniform pre-coating of fibers in tows and fabrics. The current state of the art with commercial SiCf tows (HNS, SA3) consists of depositing an interphase, just prior to matrix infiltration; a cumbersome and onerous process that yields many defects.

The FLP also exhibits unparalleled flexibility in the geometric realm as well. As part of a DOE-funded effort, the assignee has demonstrated that diameter can be controlled at will during fiber growth, leading to the first demonstration of variable diameter SiCf.

Figure 2:
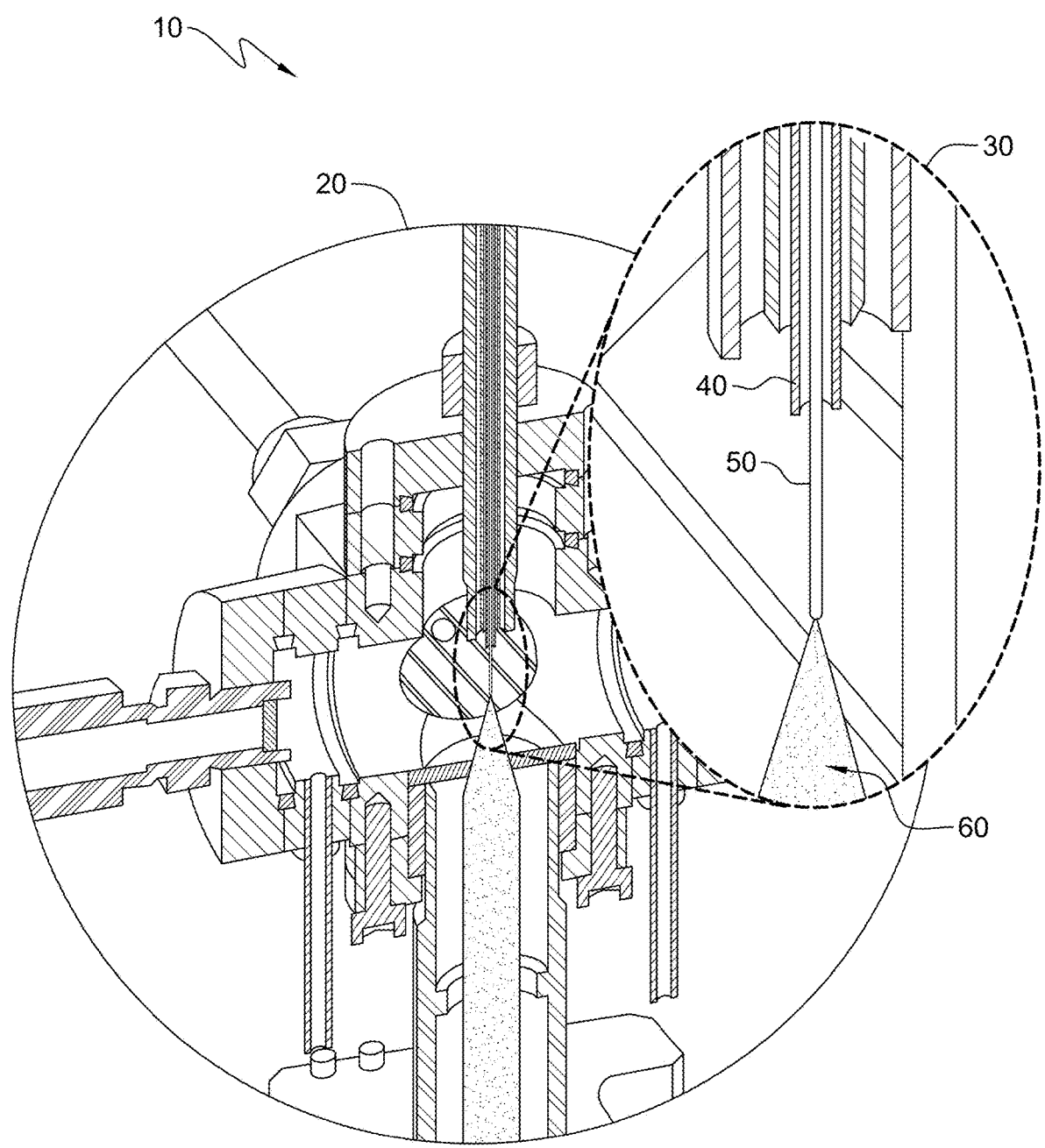
FIG. 2 is a schematic view of an exemplary process for forming a monofilament fiber.

In most cases in the prior art, fiber formation is accomplished by passing a liquid precursor through a spinneret. For example, FIG. 1 is a schematic representation of a spinneret, a plate with a pattern of tiny holes through which a liquid precursor is fed. Upon exit, the stream pattern gels into filaments called "green fibers". This prior art, however, assumes that the fiber material can exist in either a liquid, gel, or plastic form that lends itself to flowing through a small opening. In many instances, and especially for refractory materials, such a liquid or near liquid state does not exist. The present inventors have concluded, therefore, that when a spinneret is incompatible with the fiber material properties, a better approach involves extracting fiber out of a laser focus where the fiber is created from surrounding fluid precursors, which is not possible using the spinneret of FIG. 1. A laser is focused on the fiber tip thereby heating the fiber to temperatures at which the precursors dissociate and Chemical Vapor Deposition (CVD) takes place. The fiber grows in length and is pulled out of the reaction zone at the growth rate, resulting in the creation of an arbitrarily long monofilament fiber. This process technology, according to embodiments of the current invention, is illustrated by FIG. 2. FIG. 2 is a schematic of an exemplary process as follows including a reactor 10; enlarged cutout view of reactor chamber 20; enlarged view of growth region 30. A self-seeded fiber 50 grows towards an oncoming coaxial laser 60 and is extracted through an extrusion microtube 40. CVD precursors are injected into the reaction zone from the extrusion microtube forming a small high concentration plume around the reaction zone that feeds and convectively enhances growth. This plume is embedded in a coaxial flow of inert gas that shields the reaction and carries away diluted by-products. This reactor design builds upon understanding of Laser Induced Chemical Vapor Deposition (LCVD) fiber growth. It provides a unique and valuable materials science laboratory, suited for rapid experimental development of specialty filaments. It may be, however, unfit for large scale manufacturing.

As in the microelectronics fabrication industry, where features are massively replicated using optical (photolithographic) methods, large scale replication of fiber growth is herein disclosed. Pure optical parallelization for fiber growth is one approach to mass production of fibers. For example, a parallelization of the process technology illustrated by FIG. 2 can be pursued.

Figure 3:
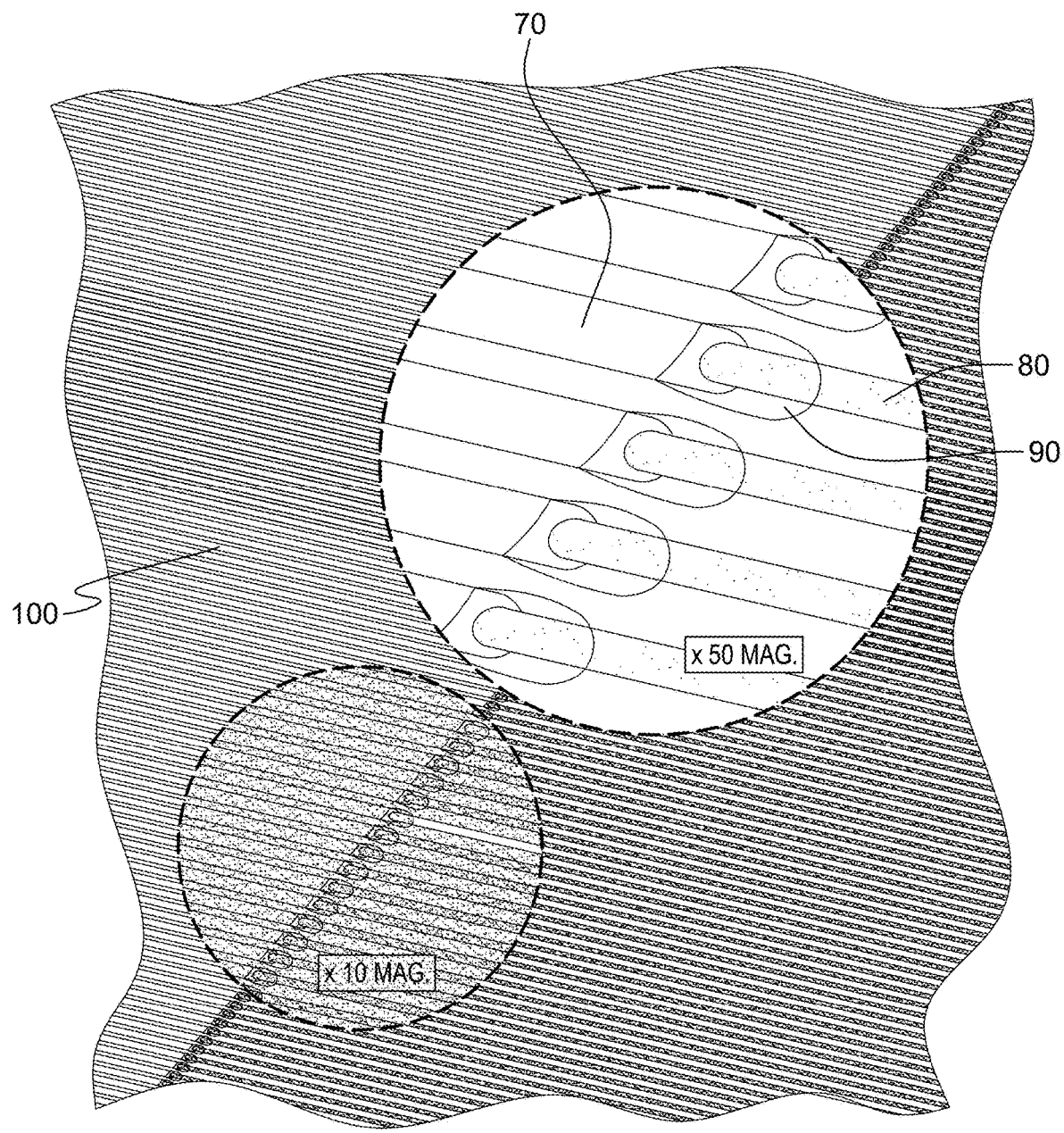
FIG. 3 is a schematic view showing how, in accordance with the present invention, fiber LCVD is massively parallelized by multiplication of the laser beams.

The present invention, in one embodiment, may involve the use of a large array of independently controlled lasers, growing an equally large array of fibers 80 in parallel, as illustrated in FIG. 3, showing how fiber LCVD can be massively parallelized from a filament lattice 100 by multiplication of the laser beams 80 inducing a plasma 90 around the tip of each fiber 80. In embodiments of the current invention, the large array of fibers 80 can be directed toward a substrate, growing standing fibers in a large array directly on a substrate, and controlling the environment at the tip of the laser to control the material system, and change the material system, of the fibers.

Figure 4:
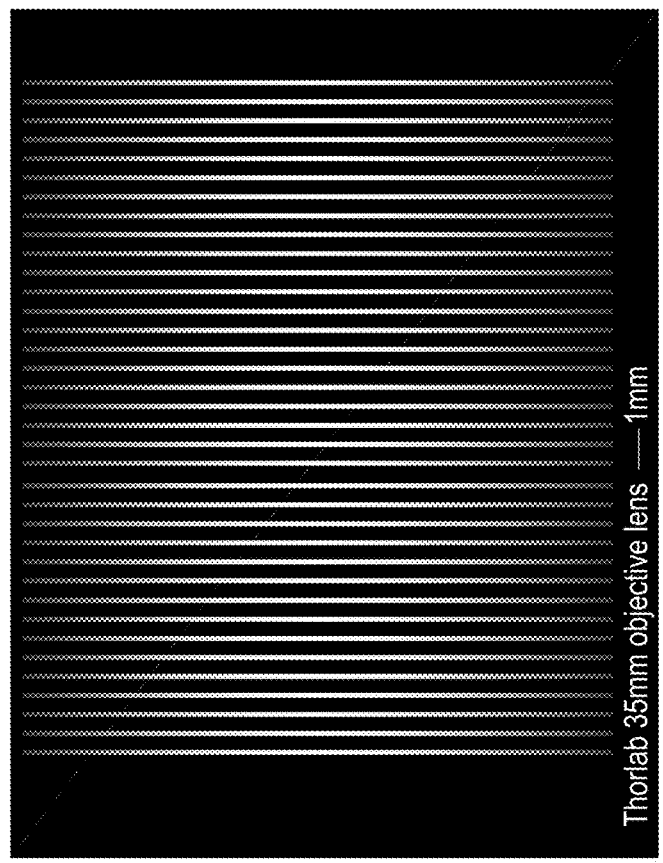
FIG. 4 shows parallel LCVD growth of carbon fibers using a module including 64 individually controlled laser emitters, in accordance with the present invention.
Figure 4:
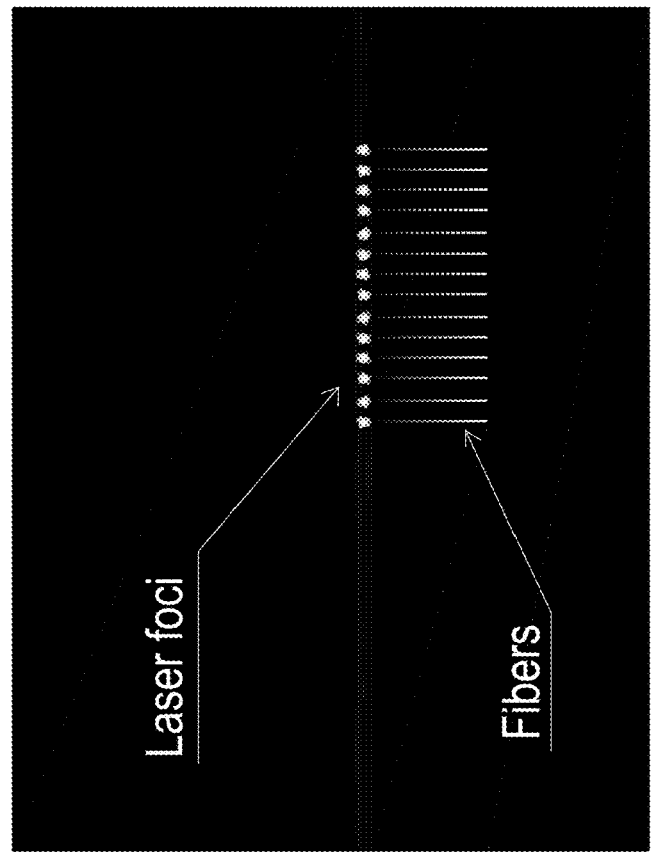

Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 4, were grown in parallel. FIG. 4 shows parallel LCVD growth of carbon fibers using a unit with multiple lasers, for instance 64 or more. Left: Fibers during growth. Right: Resulting free standing fibers 10-12 μm in diameter and about 5 mm long.

In all prior approaches the beam was focused to a diffraction limited spot with long Raleigh range. In accordance with the present invention, not only is the focus intense enough to sustain CVD, but the shallow depth of field means that fibers could only grow in a small region in the front and back of the image plane. This goes against commonly accepted practice in LCVD where long depths of field are favored to maximize the growth region. The advantage of a shallow depth of field is important because of the level of control it could afford. For example, if one fiber stopped growing for any reason, the focus can be moved back to that fiber tip. All other growths would stop and then restart as the lagging fiber was pulled back to the same level as the others.

The effect of a shallow depth of focus according to some embodiments of the invention, is illustrated in FIG. 4. The uneven focus-to-focus power distribution of diffraction gratings combined with the long depth of focus of diffraction limited optics prevents any control over the position of the growth front in previous fiber arrays. A major benefit is evident in FIG. 4: Fibers are grown in unison, and to the same height. This was an unexpected benefit of source imaging over diffraction limited optics because the depth of focus is 5 to 30 times (vertical and horizontal respectively) shallower than the Rayleigh range of an equivalent diffraction limited focus. This turns out to be a huge advantage as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

LCVD Example—Fiber Forest Generator (FFG)

Utilizing any of the above embodiments, fibers can also be grown on a substrate using LCVD. In fact, fibers need not be continuous either. Massive arrays of short composite fibers can be derived by parallel deposition onto a base wafer using a reactor according to embodiments detailed above. A fiber array of fibers as illustrated in FIG. 5 can be printed, in some embodiments simultaneously, in order to model an array of these fiber which are implementable in fuel pellet, in some cases directly.

Figure 5:
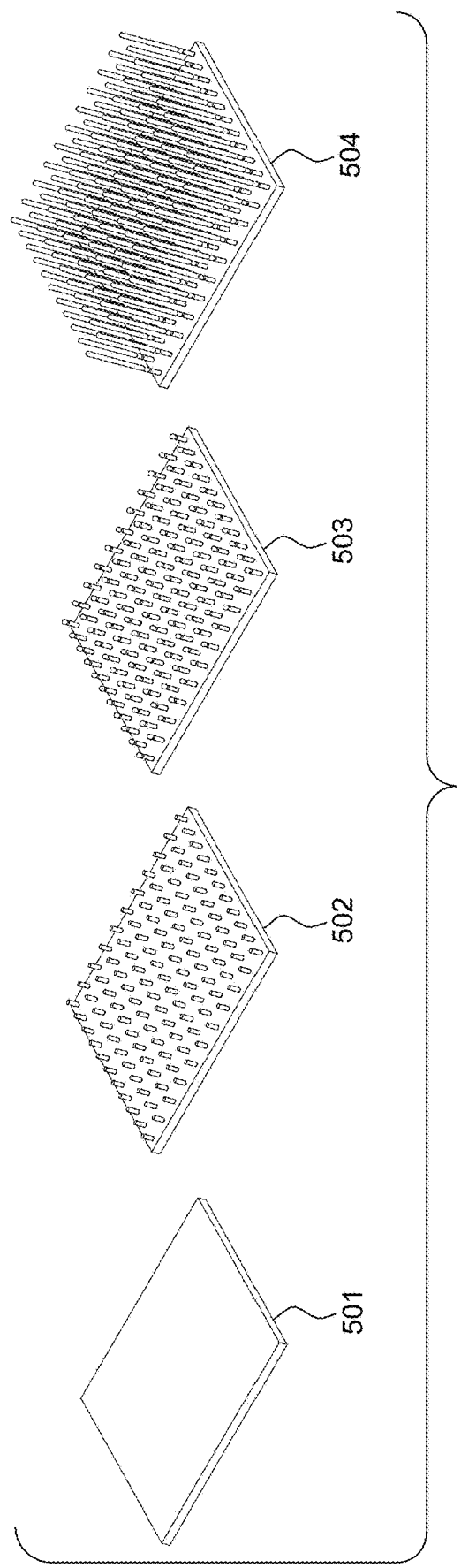
FIG. 5 illustrates a process for forming a rectangular array of fibers, in accordance with one or more aspects of the present invention.

FIG. 5 illustrates a method, according to some embodiments, of the process steps on, for instance, a square sub-section of a circular wafer, with a diameter approximately which may include, in some embodiments, a diameter of 10-15 mm. For clarity, the length scales as shown perpendicular to the wafer have been shrunk according to some embodiments. In step 501, a substrate is provided. The substrate can include a wafer substrate which may be made of a refractory, oxidation resistant, material such as SiC, ZrC, or BeO, or it may include a glass ceramic such as BMAS, BSAS, or Zirconium Silicate. In some embodiments, the substrate is not a flat surface, although not illustrated, and can include fibers previously formed according to embodiments herein described, or any solid surface. In some embodiments, at step 502, an optional array of pedestal fibers, in one or more embodiments of a refractory material such as C or SiC, are grown upon the substrate. At step 503, a first set of short fibers, are grown on the pedestals, or the substrate if no pedestals are present. At step 504, long fibers are grown on the first set of short fibers.

Figure 6A:
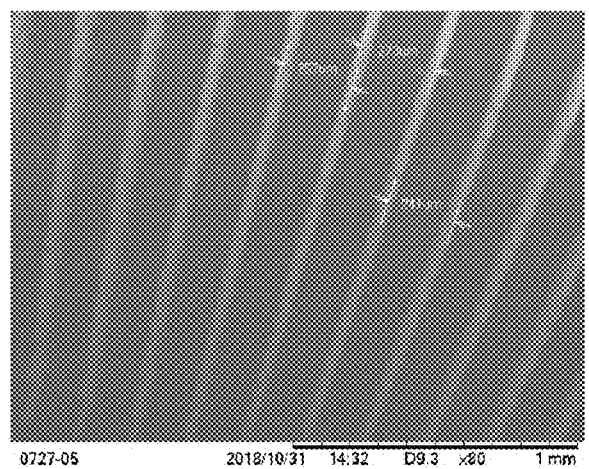
FIGS. 6A-C are SEM images of a large array of SiC fiber forests on an exemplary glassy carbon substrate at increasing magnifications, respectively, in accordance with one or more aspects of the present invention.
Figure 6B:
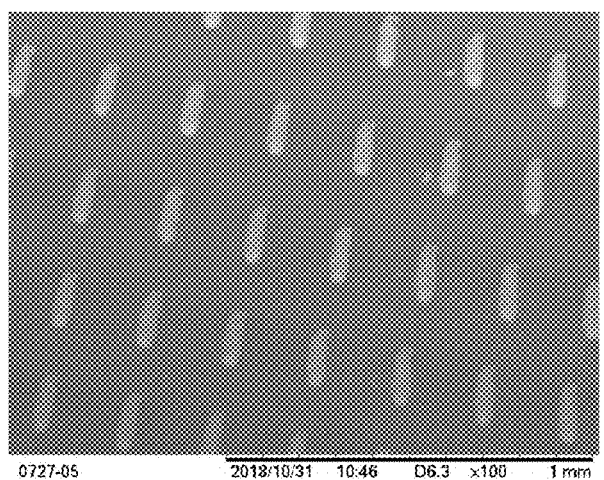
Figure 6C:
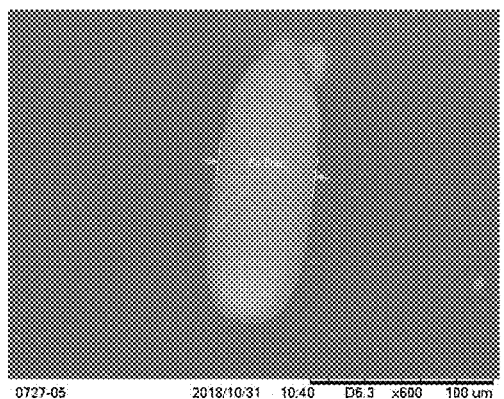
Figure 7:
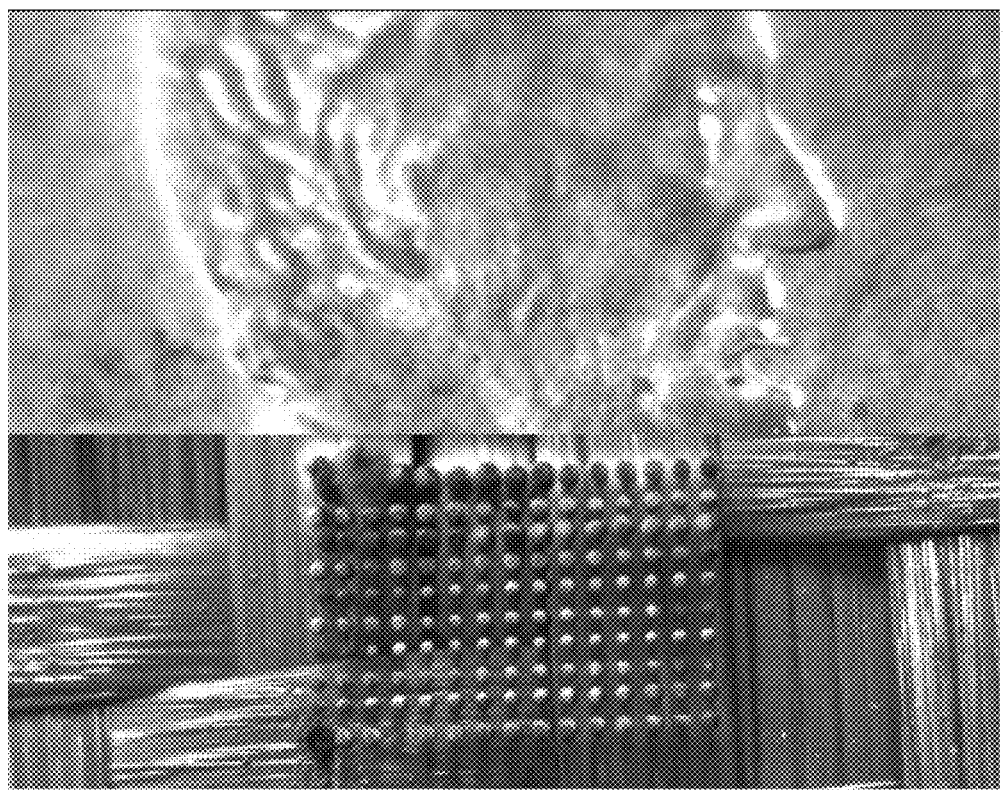
FIG. 7 shows a SiC fiber forest grown on HNS (High Nicalon-Type S) tow SiC fabric, in accordance with one or more aspects of the present invention.

The FFG can be analogized to an FLP turned perpendicular to the surface of a substrate. Doing so generates arrays of short freestanding fibers, up to ~¼ " long, as shown in FIGS. 6A-C, which are SEM images of a large array of SiC fiber forests on a glassy carbon substrate at increasing magnifications, respectively, in accordance with one or more aspects of the present invention. Fiber composition and microstructure is inherited from the FLP. Of particular interest to this invention, fiber forests have been grown on a range of substrates. FIG. 7 shows a rectangular array of SiC fibers grown atop a woven HNS fabric. The present inventors now believe these processes can be used to grow fibers on a wide variety of substrates and with a wide variety of precursors.

Summarizing, the present invention builds upon the exemplary technological innovations generally discussed above with respect to FIGS. 1-4 and FIGS. 5-7 respectively. The first innovation—the Fiber Laser Printer (FLP) is the subject of the above-incorporated publications entitled "High Strength Ceramic Fibers and Methods of Fabrication." The second, and more recent, innovation is the Fiber Forest Generator (FFG) which is the subject of the above-incorporated publications entitled "Functional High-Performance Fiber Structure." Both innovations rely on the same principle of Rapid Laser-Induced Chemical Vapor Deposition (R-LCVD) using a laser beam for each per fiber, although the use of a single laser and/or diffraction gratings also fall within the scope of the present invention. In the FLP example, fibers can be self-seeded and the product is a continuous ribbon of identical straight filaments, parallel to each other. In the FFG example, fibers are seeded on a flat substrate, resulting in a massive array of anchored freestanding short filaments, as seen in FIGS. 6A-C, which are SEM images of a large array of SiC fiber forests on a glassy carbon substrate at increasing magnifications, respectively, in accordance with one or more aspects of the present invention.

SiC Powder Formation Example

As one example in accordance with the present invention, for silicon carbide fiber, varying the gas precursor mix can lead to a range of fiber chemistries, from carbon-rich to silicon-rich. In all conditions, the SiC fiber can have a beta phase content greater than 90%. The present inventors have discovered that depending on at the right precursor settings and LCVD deposition parameters, stoichiometric SiC (a 1:1 ratio of Si:C) can be formed in a rough fiber morphology, somewhat akin to loose SiC 'boulders' glued together, because the LCVD deposition process for silicon carbide is a high nucleation-low growth rate regime, forming many nanocrystalline grain sites that do not grow quickly. The resulting SiC fibers can therefore be a friable material that is mechanically weak and breaks apart quite easily.

Figure 8A:
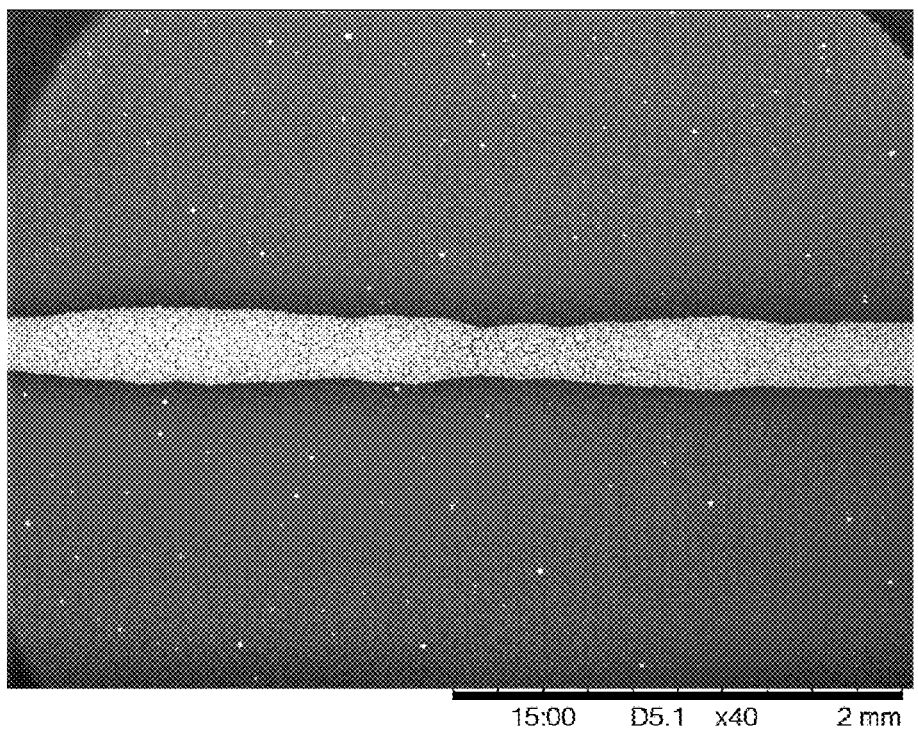
FIGS. 8A-B are SEM images of a SiC fiber and a highly magnified section thereof.
Figure 8B:
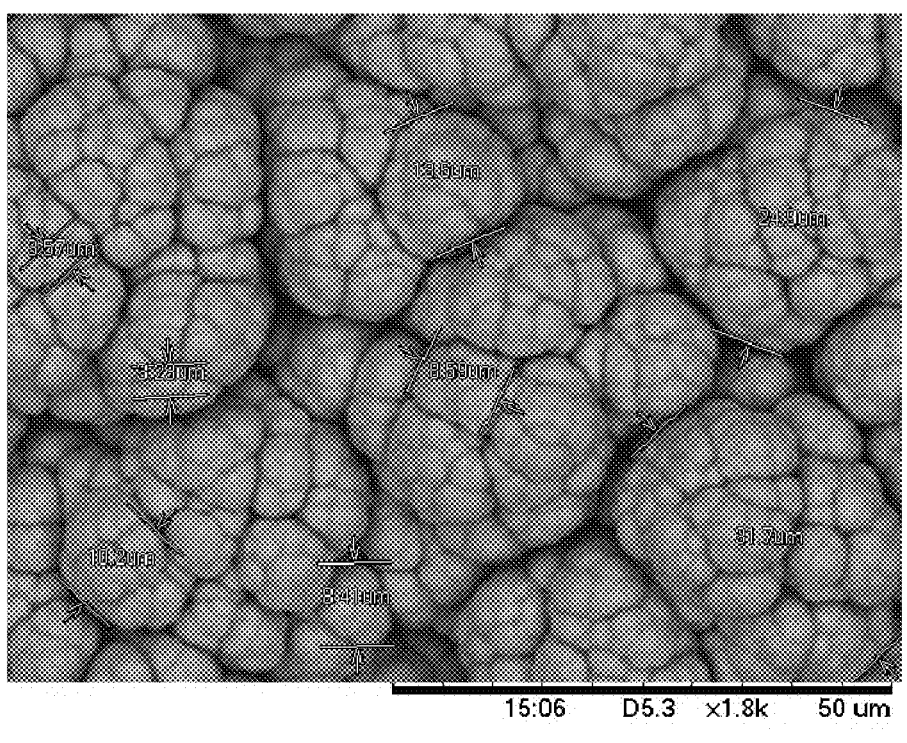
Figure 9A:
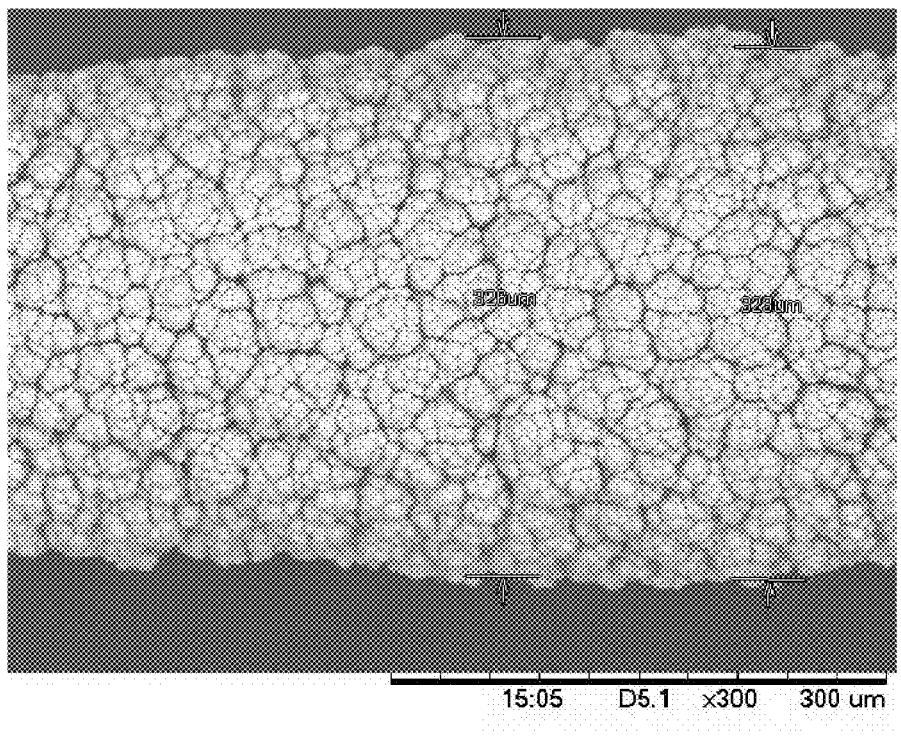
FIGS. 9A-B are SEM images of the SiC fiber of FIG. 8A showing two separate sections thereof of differing diameter.
Figure 9B:
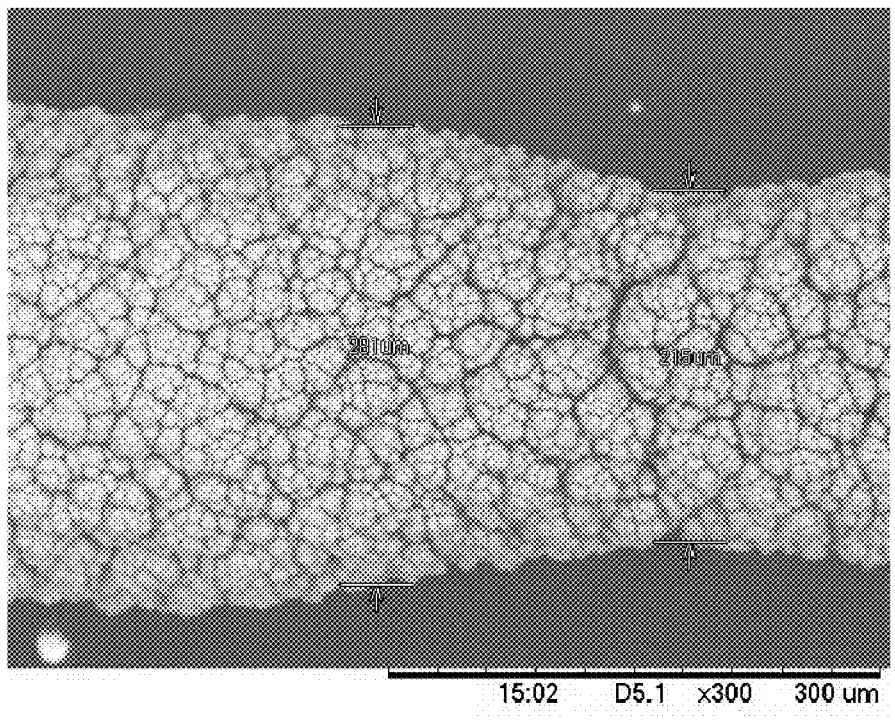

FIGS. 8A-B are SEM images of an SiC fiber (relatively large in diameter—about 200 to 300 um) and a highly magnified section thereof, showing the coarse and friable composition desirable in such fibers, akin to boulders glued together. FIGS. 9A-B are SEM images of the SiC fiber of FIG. 8A showing two separate sections thereof of differing diameter, from about 215 um to about 326 um.

In accordance with the present invention, a light grinding or milling or similar procedure can quickly and efficiently reduce the produced fibers to a coarse and/or ultimately finer granular form, e.g., powder (depending on the level of processing applied).

Figure 10A:
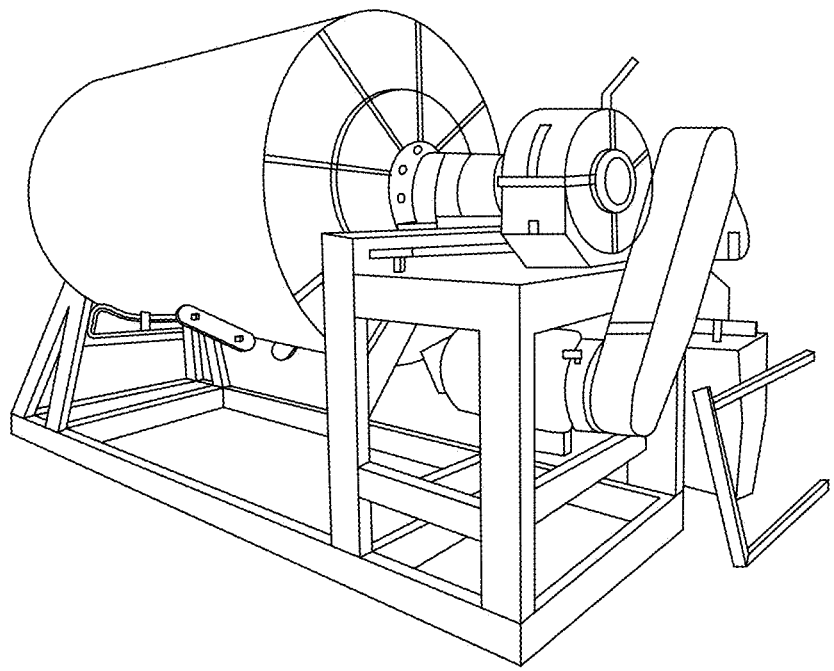
FIGS. 10A-B are schematic drawings of an exemplary ball mill useable for producing the powder from fiber, in accordance with an aspect of the present invention.
Figure 10B:
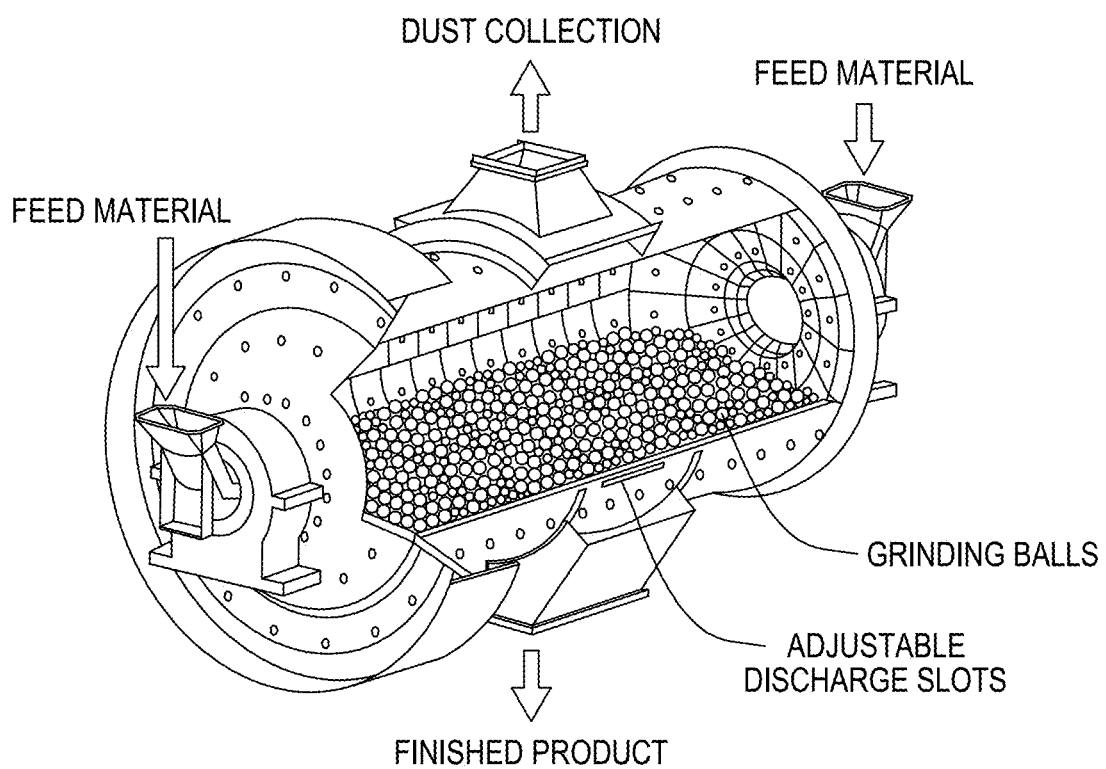

As one example, FIGS. 10A-B are schematic drawings of an exemplary ball mill useable for producing the powder from fiber, in accordance with an aspect of the present invention. Such ball mills are commercially available. In accordance with the present invention, fibers can be deposited into the body as feed material, ground into the appropriate, controllable sizes upon mill activation, and then collected as finished product after milling is complete. Other types of mechanical grinding or milling may be employed in accordance with the present invention, for example, jet milling.

Figure 11:
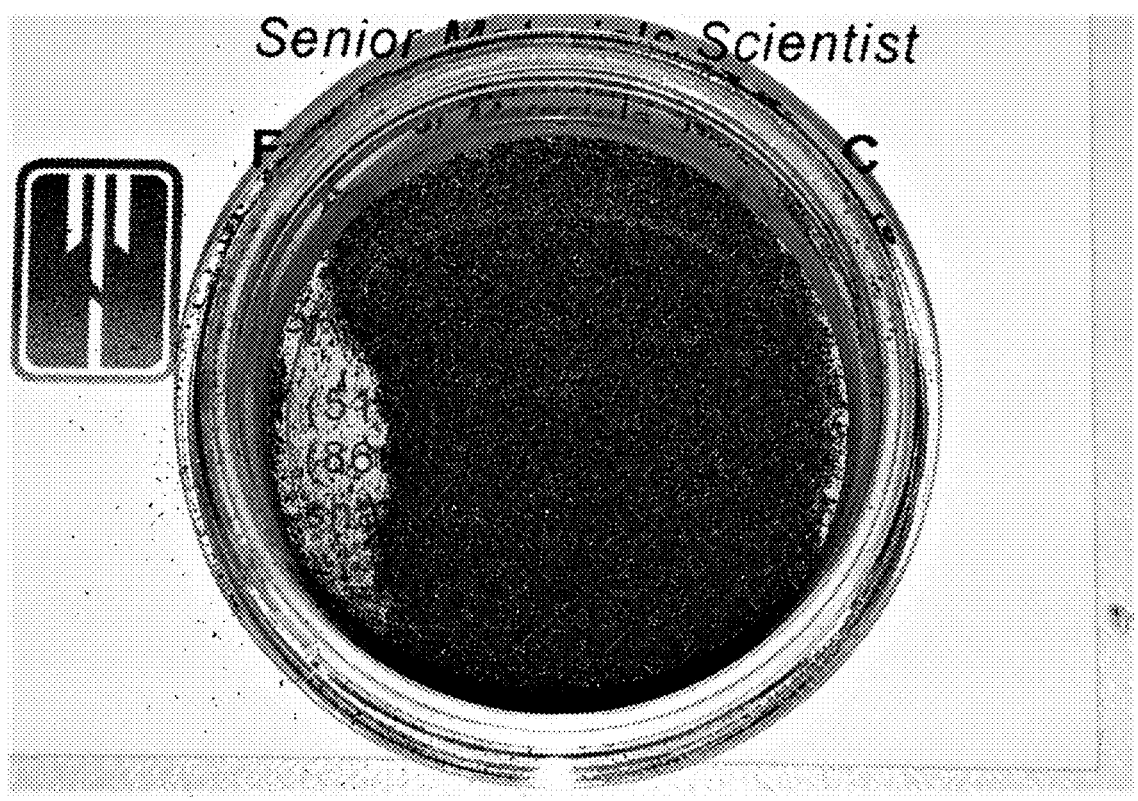
FIG. 11 is an image of a batch of exemplary silicon carbide powder formed in accordance with the principles of the present invention, depicted over a portion of a business card to demonstrate scale.

FIG. 11 is an image of a batch of exemplary silicon carbide powder formed in accordance with the principles of the present invention, depicted over a portion of a business card to demonstrate scale.

Ingot/Wafer Formation Example

For SiC powder made from LCVD, the electrical conductivity performance, measured in Siemens per meter (S/m), of the resulting material can be enhanced through doping with atoms of selected elements. In one or more embodiments, this doping level can range from several hundred parts per million down to single digit parts per billion. These doping elements can be electron acceptors, or p-type, from the Group III column on the periodic table, including boron, gallium, and indium, or donors. Group V column elements act as electron donors, or n-type, dopants and can be nitrogen, arsenic, and phosphorous. For instance, nitrogen-doped SiC powder can be made from LCVD-produced fibers with a gas precursor mixture of silane, ethylene, and diatomic nitrogen. The doping levels present in the powder are, in one or more embodiments, in the several hundred parts per million range.

Figure 12:
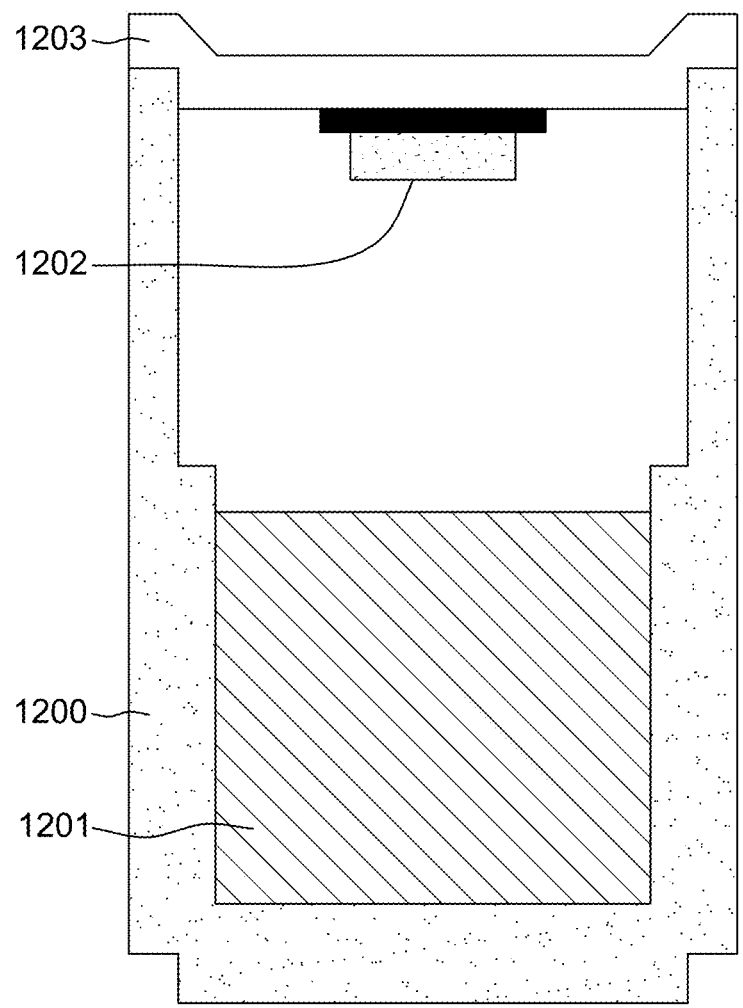
FIG. 12 depicts one embodiment of a physical vapor transport process for forming an ingot from granular material, in accordance with one or more aspects of the present invention.

Another application for SiC powder is as a feedstock in the fabrication of high power semiconductors that utilize SiC wafers instead of silicon wafers due to the high voltage and high operational temperatures required. In one embodiment, SiC wafers can be produced by thinly slicing SiC boules that are made via a process called physical vapor transport (PVT). High purity, high quality SiC powder is the valuable feedstock desired for PVT processing. A representative diagram of the PVT process is depicted in FIG. 12, and described below.

In one embodiment, the process starts with the inclusion of SiC powder 1201 inside a crucible container 1200 that is placed inside a furnace. The furnace can be heated with graphite heating elements so as to be able to reach and withstand the required operating temperature(s). At the top surface of container 1200, or the furnace, a SiC seed crystal 1202 of the desired crystalline type (for instance, a hexagonal phase, such as the 4H polytype) is mounted, such as by using an adhesive affixed to a graphite lid 1203 to the container or furnace. The SiC powder 1201 is heated to temperatures in a 2000° C. to 2220° C. range, for instance, leading to sublimation of the material to a gas phase inside the furnace volume. The SiC gas molecules then migrate to the seed crystal and deposit in the solid phase in the preferred crystallographic orientation imparted by the seed. In this manner, a SiC ingot or boule is produced, consuming the SiC powder in the crucible. There are certain powder parameters that drive efficient production of an ingot, as well as minimization of the formation of crystalline defects which negatively impact electronic performance in the SiC wafers produced from the ingot or boule. For instance, the powder packing density and particle size distribution characteristics, such as the $d_{50}$ median particle size, can drive efficient ingot/boule fabrication within the PVT process. Packing densities in the range of 1.5 to 1.7 grams/cubic centimeter and $d_{50}$ values in the 200 to 350 micrometer (micron) range, such as in the 250 to 300 micrometer (micron) range, yield quality SiC ingots. These particle sizes are significantly larger than typically desired in sintering and powder processing-based fabrication techniques like AM, which are on the order of less than 1 micron up to 15 microns. The friable nature of the LCVD SiC fiber feedstock provides for straightforward processing through simple milling to achieve these grain size targets. Another important powder consideration is purity. For instance, the presence of excess carbon in the starting SiC powder would lead to elevated macro defect density in the formed ingot. The purity of LCVD-based SiC powder, with no excess carbon or oxygen present, results in reduced defect density in the ingot's crystalline structure. Once the SiC ingot is produced, the SiC wafers can be separated (such as sliced) from the ingot using standard semiconductor wafer formation techniques.

Unique Compositions

Another important feature of LCVD is the ability to combine multiple gas precursor materials to deliver several elements to the gas phase reaction, resulting in unique compositions that have multiple phases of materials present. For instance, the combination of silane, ammonia, and boron trichloride gases in a LCVD reaction can yield an intimately mixed combination of silicon nitride and boron nitride. In accordance with the present invention, these complex compositions and chemistries then carry through from the fibers to the powder format. Whether in fiber or powder format, these multi-phase materials offer previously unavailable blending of material properties to address high tech application requirements. Therefore, in accordance with the present invention, any additional compositions and/or chemistries formed during the LCVD process will persist in the powder format.

In addition, specific chemical species can be introduced via careful gas precursor selection with the intent of fostering a desired performance behavior in the deposited material, whether the format is in fiber or an ultimate powder form. The amount of the species would be nominally as a trace quantity. For example, a refractory metal, with a melting point above 2000° C., could be added as an in-situ getter in order to capture the free oxygen that is ingressing and thereby enhance the oxidation resistance of the material. Metals like hafnium, zirconium, and titanium would be candidate getters with high affinity for oxygen.

In addition, fiber cores can be formed first, over which the subject materials can be deposited using LCVD (e.g., silicon carbide or other desired materials). Before or after milling, the core material can remain in the fibers, or be removed using any suitable removal process (i.e., heating, solvents, etc.).

Shape and Coating Additions

In accordance with an aspect of the present invention, the grains formed can also be specially shaped and/or coated. Grains can be milled into a particular shape to maximize their fracture toughness with a high surface area to volume ratio. Optimizing this ratio increases the amount of fracture energy that can be absorbed. For example, a spherical shape can better dissipate fracture energy. Also, coatings (e.g., interphase—boron nitride, carbon, beryllium oxide) may be applied to grains to additionally enhance the composite fracture toughness behavior. Without a coating, grains may be susceptible to failure due to crack propagation through the grain. A coating can absorb and/or deflect a crack, allowing the grains to maintain their mechanical integrity. Additional coatings, such as silicon carbide, can serve as environmental protection barriers for the grains.

Example Nuclear Application

The fibers and associated manufacturing techniques discussed herein can attain numerous structures and compositions in accordance with all of the above-incorporated patent applications. Notably, any elements which are desired and which are compatible with the fiber formation processes disclosed herein (e.g., LCVD), and for which a granular or other processed form is desired, fall within the scope of the present invention. As one example, nuclear fuel formation as part of fibers and fiber-related structures is disclosed in the above-entitled Patent Applications entitled "An Additive Manufacturing Technology For The Fabrication and Characterization Of Nuclear Reactor Fuel;" "Functional High-Performance Fiber Structure;" and "Non-Woven Micro-Trellis Fabrics and Composite or Hybrid-Composite Materials Reinforced Therewith." In accordance with one aspect of the present invention, high purity fibers can be formed with various nuclear fuel materials. In one aspect of the present invention, the nuclear material fibers can then be ground or milled into a granular form, for use wherever such fuel materials are required. The fuel grains can then be formed into fuel pellets, or other fuel structures. In this regard, nuclear fuel production can benefit from the manufacturing scale and purity of the fiber formation and grain milling processes of the present invention. Example nuclear fuel materials include but are not limited to: uranium, plutonium, uranium dioxide, uranium nitride, uranium mononitride, uranium carbide, and/or uranium silicide.

Summarizing, the present invention in one aspect is a method of forming a high purity granular material, including providing precursors in a reactor; forming at least part of a fiber in the reactor from the precursors using chemical deposition interacting with said precursors; and forming the granular material from the fiber. In one aspect, the chemical deposition may include laser induced chemical vapor deposition. The granular material may be formed by grinding or milling the fiber into the granular material, e.g., ball milling the fiber.

In another aspect, a plurality of fibers maybe formed in parallel using a single laser beam, or multiple laser beams that have independent power control, or multiple laser beams that do not have independent power control. At least one element may be added during the chemical deposition, which serves as a free oxygen getter to improve the oxidation resistance of the granular material; and the granular material can be specially shaped and/or coated.

The granular material may in certain aspects be a silicon carbide powder having greater than 90% beta crystalline phase purity and less than 0.25% oxygen contamination; or a multi-element and multiphase composition powder having less than 0.25% oxygen contamination; or a nuclear fuel material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A method of forming a high purity ingot, comprising:
providing precursors in a reactor;
forming a stoichiometric SiC fiber in the reactor from the precursors, including using laser-induced chemical vapor deposition interacting with said precursors, the stoichiometric SiC fiber being a friable fiber;
forming a granular material from the fiber; and
forming the ingot from the granular material.

2. The method of claim 1, wherein forming the ingot comprises forming the ingot via physical vapor transport processing.

3. The method of claim 1, wherein the silicon carbide powder has greater than 90% beta crystalline phase purity and less than 0.25% oxygen contamination.

4. The method of claim 1, wherein forming the granular material comprises grinding or milling the fiber into the granular material.

5. The method of claim 4, wherein forming the granular material comprises ball milling the fiber.

6. The method of claim 1, further comprising:
forming a plurality of fibers in parallel using a single laser beam, or multiple laser beams that have independent power control, or multiple laser beams that do not have independent power control; and
forming the granular material from the plurality of fibers.

7. The method of claim 1, further comprising:
adding at least one element during the chemical deposition, which serves as a free oxygen getter to improve the oxidation resistance of the granular material.

8. The method of claim 1, wherein the granular material comprises a multi-element and multiphase composition powder having less than 0.25% oxygen contamination.

9. A method of forming a wafer, comprising:
providing precursors in a reactor;
forming a stoichiometric SiC fiber in the reactor from the precursors, including using laser-induced chemical vapor deposition interacting with said precursors, the stoichiometric SiC fiber being a friable fiber;
forming a granular material from the fiber;
forming an ingot from the granular material; and
separating the wafer from the ingot.

10. The method of claim 9, wherein forming the ingot comprises forming the ingot via physical vapor transport processing.

11. The method of claim 9, wherein the silicon carbide powder has greater than 90% beta crystalline phase purity and less than 0.25% oxygen contamination.

12. The method of claim 9, wherein forming the granular material comprises grinding or milling the fiber into the granular material.

13. The method of claim 12, wherein forming the granular material comprises ball milling the fiber.

14. The method of claim 9, further comprising:
adding at least one element during the chemical deposition, which serves as a free oxygen getter to improve oxidation resistance of the granular material.

* * * * *